United States Patent
Kim

(10) Patent No.: US 9,666,834 B2
(45) Date of Patent: May 30, 2017

(54) ORGANIC LIGHT-EMITTING DISPLAY APPARATUS AND MANUFACTURING METHOD THEREOF

(71) Applicant: SAMSUNG DISPLAY CO., LTD., Yongin, Gyeonggi-Do (KR)

(72) Inventor: Bongju Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/730,888

(22) Filed: Jun. 4, 2015

(65) Prior Publication Data

US 2016/0218319 A1    Jul. 28, 2016

(30) Foreign Application Priority Data

Jan. 28, 2015    (KR) ........................ 10-2015-0013549

(51) Int. Cl.
| H01L 29/08 | (2006.01) |
| H01L 51/52 | (2006.01) |
| H01L 51/50 | (2006.01) |
| H01L 27/32 | (2006.01) |
| H01L 21/768 | (2006.01) |

(52) U.S. Cl.
CPC ...... *H01L 51/5256* (2013.01); *H01L 51/5246* (2013.01); *H01L 21/76885* (2013.01); *H01L 27/3209* (2013.01); *H01L 51/50* (2013.01); *H01L 2251/56* (2013.01)

(58) Field of Classification Search
CPC . H01L 51/5256; H01L 27/3248; H01L 51/56; H01L 51/5012; H01L 51/5206; H01L 51/5221; H01L 2227/323

USPC ........................................................ 257/40
See application file for complete search history.

(56) References Cited

U.S. PATENT DOCUMENTS

| 2011/0156578 A1* | 6/2011 | Jeon ................... H01L 51/5253 |
| | | 313/506 |
| 2013/0206230 A1* | 8/2013 | Sridharan ............... H01L 23/10 |
| | | 136/259 |
| 2013/0328855 A1 | 12/2013 | Li et al. |
| 2014/0138651 A1 | 5/2014 | Oh |

FOREIGN PATENT DOCUMENTS

| JP | 2010-49986 A | 3/2010 |
| JP | 2013-77460 A | 4/2013 |
| KR | 10-2012-0045477 A | 5/2012 |
| KR | 10-2014-0004170 A | 1/2014 |
| KR | 10-2014-0064154 A | 5/2014 |

* cited by examiner

*Primary Examiner* — Tod T Van Roy
*Assistant Examiner* — Vu A Vu
(74) *Attorney, Agent, or Firm* — Lee & Morse, P.C.

(57) ABSTRACT

An organic light-emitting display apparatus and a method of manufacturing an organic light-emitting display apparatus, the apparatus including a substrate; an organic light-emitting diode (OLED), the OLED including a pixel electrode on the substrate; an opposite electrode that faces the pixel electrode; and an emission layer between the pixel electrode and the opposite electrode; and a protection layer that covers the OLED, wherein the protection layer includes an alternate layer formed by alternately arranging organic layers and inorganic layers on a same layer.

12 Claims, 4 Drawing Sheets

ORGANIC LIGHT-EMITTING DISPLAY APPARATUS AND MANUFACTURING METHOD THEREOF

CROSS-REFERENCE TO RELATED APPLICATION

Korean Patent Application No. 10-2015-0013549, filed on Jan. 28, 2015, in the Korean Intellectual Property Office, and entitled: "Organic Light-Emitting Display Apparatus and Manufacturing Method Thereof," is incorporated by reference herein in its entirety.

BACKGROUND

1. Field

Embodiments relate to an organic light-emitting display apparatus and a method of manufacturing the same.

2. Description of the Related Art

In general, an organic light-emitting display apparatus may include a display unit having a structure including an emission layer that is formed of an organic material and is between an anode and a cathode. When voltages are respectively applied to the anode and cathode, excitons may be formed from a combination of holes injected from the anode and electrons injected from the cathode. Accordingly, light is emitted when the excitons drop from an excitation state to a ground state, and thus, an image can be displayed.

SUMMARY

Embodiments are directed to an organic light-emitting display apparatus and a method of manufacturing the same.

The embodiments may be realized by providing ng an organic light-emitting display apparatus including a substrate; an organic light-emitting diode (OLED), the OLED including a pixel electrode on the substrate; an opposite electrode that faces the pixel electrode; and an emission layer between the pixel electrode and the opposite electrode; and a protection layer that covers the OLED, wherein the protection layer includes an alternate layer formed by alternately arranging organic layers and inorganic layers on a same layer.

The inorganic layers may be formed in a pixel area overlying the emission layer, and the organic layers may be formed in an area other than the pixel area.

The organic light-emitting display apparatus may further include an encapsulation substrate on the protection layer, the encapsulation substrate facing the substrate; and a filling layer filling a space between the protection layer and the encapsulation substrate.

The organic light-emitting display apparatus may further include a thin film transistor connected to the pixel electrode.

The organic light-emitting display apparatus may further include at least one monolayer on the alternate layer, wherein the at least one monolayer is an organic layer or an inorganic layer.

The embodiments may be realized by providing ng a method of manufacturing an organic light-emitting display apparatus, the method including forming an organic light-emitting diode (OLED) on a substrate such that the OLED includes a pixel electrode on the substrate, an opposite electrode that faces the pixel electrode, and an emission layer between the pixel electrode and the opposite electrode; and forming a protection layer that covers the OLED, wherein forming the protection layer includes forming an alternate layer by alternately arranging organic layers and inorganic layers on a same layer.

The inorganic layers may be formed in a pixel area overlying the emission layer, and the organic layers may be formed in an area other than the pixel area.

The method may further include providing an encapsulation substrate on the protection layer such that the encapsulation substrate faces the substrate; and filling a space between the protection layer and the encapsulation substrate with a filling layer.

The method may further include forming a thin film transistor connected to the pixel electrode.

Forming the protection layer may include forming at least one monolayer on the alternate layer such that the at least one monolayer is an organic layer or an inorganic layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
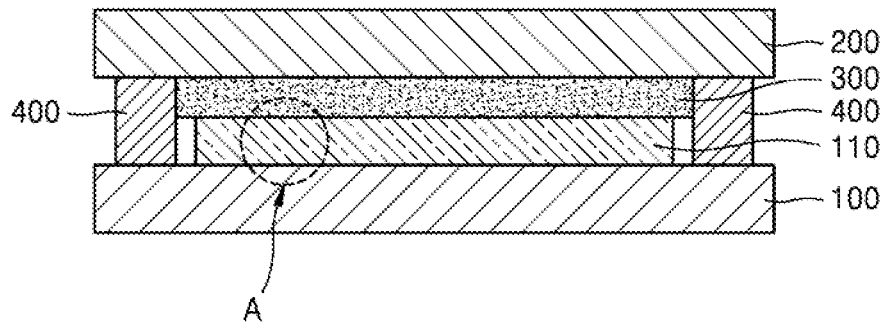
FIG. 1 illustrates a cross-sectional view of an organic light-emitting display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

An expression used in the singular encompasses the expression of the plural, unless it has a clearly different meaning in the context.

In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a component, such as a layer, a film, a region, or a plate, is referred to as being "on" another component, the component can be directly on the other component or intervening components may be present thereon.

When a certain embodiment may be implemented differently, a specific process order may be performed differently from the described order. For example, two consecutively described processes may be performed substantially at the same time or performed in an order opposite to the described order.

Figure 2:
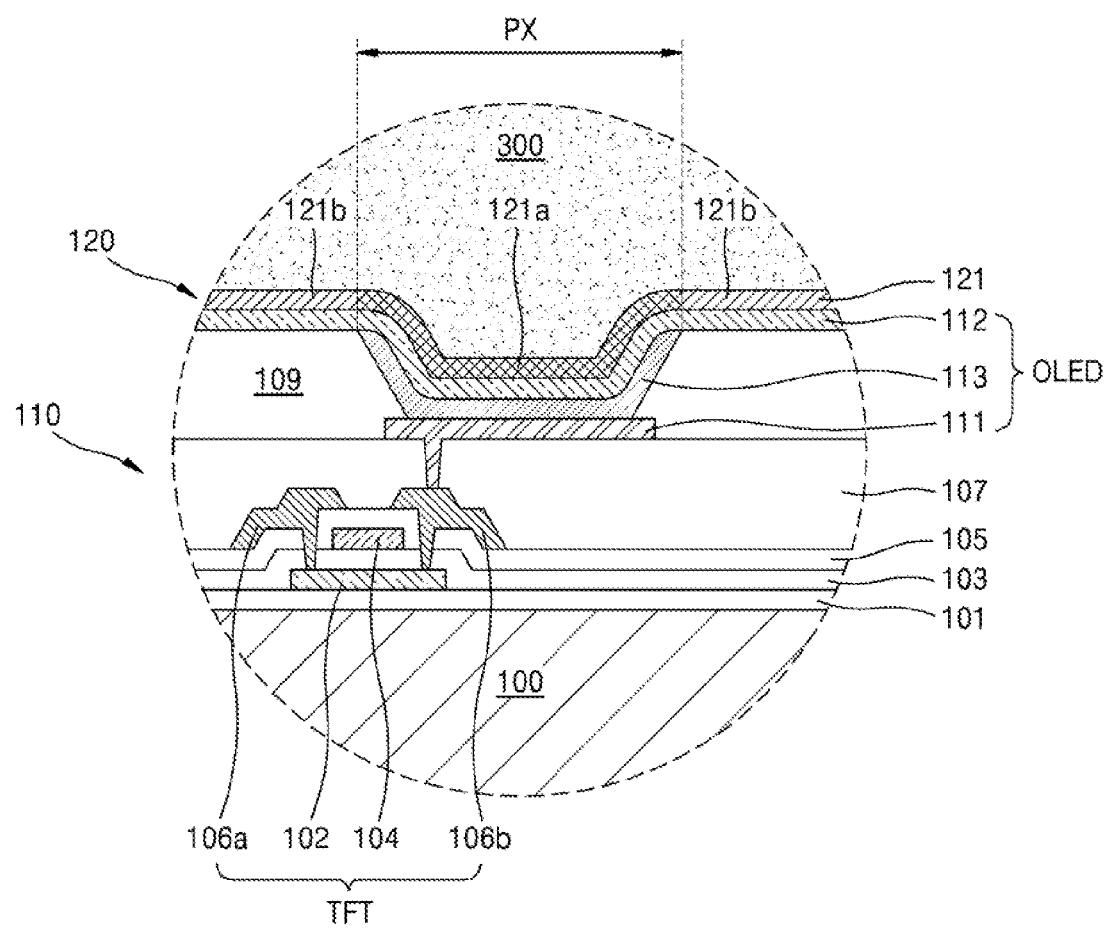
FIG. 2 illustrates an enlarged view of an area A of FIG. 1.

FIG. 1 illustrates a cross-sectional view of an organic light-emitting display apparatus according to an exemplary embodiment. FIG. 2 illustrates an enlarged view of an area A of FIG. 1.

Referring to FIGS. 1 and 2, the organic light-emitting display apparatus may include a display unit 110 formed on a substrate 100, an encapsulation substrate 200 arranged opposite to the substrate 100, a sealant 400 sealing the display unit 110 by attaching the substrate 100 to the encapsulation substrate 200, and the like. A filling layer 300 may be used to fill a space between the encapsulation substrate 200 and the display unit 110.

The substrate 100 may be formed of, e.g., transparent glass mainly containing silicon oxide ($SiO_2$). In an implementation, the substrate 100 may be formed of, e.g., transparent plastics. The plastics used to form the substrate 100 may include an insulating organic material, e.g., polyethersulphone (PES), polyacrylate (PAR), polyetherimide (PE), polyethyelenennapthalate (PEN), polyethyeleneterepthalate (PET), polyphenylenesulfide (PPS), polyallylate, polyimide, polycarbonate (PC), cellulose triacetate (TAC), and/or celluloseacetatepropionate (CAP).

When the organic light-emitting display apparatus is of a bottom emission type so that an image is displayed in a direction toward the substrate 100, the substrate 100 may be formed of a transparent material. When the organic light-emitting display apparatus is of a top emission type so that an image is displayed in a direction opposite to the substrate 100, it may not be necessary to form the substrate 100 of a transparent material. In this case, the substrate 100 may be formed of, e.g., a metal. The substrate 100 formed of a metal may include, e.g., carbon (C), iron (Fe), chromium (Cr), manganese (Mn), nickel (Ni), titanium (Ti), molybdenum (Mo), and/or stainless steel (SUS). In an implementation, the substrate 100 may be formed of metallic foil.

A buffer layer 101 may be formed on the substrate 100 in order to provide planarity and to help prevent impurities from penetrating the substrate 100. The buffer layer 101 may be formed of, e.g., $SiO_2$ and/or silicon nitride (SiNx), and may be deposited by various methods, e.g., plasma enhanced chemical vapor deposition (PECVD), atmospheric pressure CVD (APCVD), or low pressure CVD (LPCVD). In an implementation, the buffer layer 101 may be omitted.

A thin film transistor (TFT) may be formed on the buffer layer 101 of the substrate 100. Referring to FIG. 2, the TFT may be connected to a pixel area PX for convenience of explanation. In an implementation, a plurality of TFTs may be connected to each pixel area PX.

The TFT of FIG. 2 is of a top gate type, and an active layer 102, a gate electrode 104, a source electrode 106a, and a drain electrode 106b are sequentially stacked in the TFT. In the present exemplary embodiment, the TFT is of the top gate type. In an implementation, types of the TFT may vary.

The active layer 102 may be obtained by forming an inorganic semiconductor layer, such as a silicon (Si) layer, and an oxide semiconductor layer, an organic semiconductor layer, or the like on an entire surface of the substrate 100 on the buffer layer 101 and then patterning the same. When the active layer 102 is formed of Si, an amorphous silicon layer may be formed on the entire surface of the substrate 100 and then crystallized, thereby forming a polycrystalline layer. After the polycrystalline layer is patterned, a source area and a drain area are doped with impurities, and thus, the active layer 102 that includes the source area, the drain area, and a channel area disposed therebetween may be formed.

A gate insulating layer 103 formed of, e.g., $SiO_2$, SiNx, or the like, may be formed on the active layer 102, and the gate electrode 104 may be formed on a predetermined portion of an upper surface of the gate insulating layer 103. The gate electrode 104 may be connected to a gate line (not shown) transmitting on/off signals of the TFT.

An interlayer insulating layer 105 may be formed on the gate electrode 104, and the source electrode 106a and the drain electrode 106b may respectively contact a source area and a drain area of the active layer 102 via contact holes. The TFT may be covered by a passivation layer 107 for protection.

The passivation layer 107 may be an inorganic insulating layer or an organic insulating layer. The inorganic insulating layer may include, e.g., $SiO_2$, SiNx, SiON, $Al_2O_3$, $TiO_2$, $Ta_2O_5$, $HfO_2$, $ZrO_2$, BST, PZT, or the like, and the organic insulating layer may include, e.g., poly(methyl methacrylate) (PMMA, PS), polymer derivatives having a phenol-based group, an acryl-based polymer, an imide-based polymer, an acryl ether-based polymer, an amide-based polymer, a fluorine-based polymer, a p-xylene-based polymer, a vinyl alcohol-based polymer, and any combination thereof. In an implementation, the passivation layer 107 may be a stack layer in which the inorganic insulating layer and the organic insulating layer are stacked.

An organic light-emitting diode (OLED) may be formed on the passivation layer 107.

The OLED may include a pixel electrode 111 on the passivation layer 107, an opposite electrode 112 facing the pixel electrode 111, and an emission layer 113 disposed therebetween. The organic light-emitting display apparatus may be of a bottom emission type, a top emission type, a dual emission type, or the like, depending on a light-emission direction. When the organic light-emitting display apparatus is of the bottom emission type, the pixel electrode 111 may be a transparent electrode, and the opposite electrode 112 may be a reflective electrode. When the organic light-emitting display apparatus is of the top emission type, the pixel electrode 111 may be a reflective electrode, and the opposite electrode 112 may be a transparent electrode.

The pixel electrode 111 may be patterned in an island form corresponding to each pixel area PX. The pixel electrode 111 may be connected to the drain electrode 106b of the TFT and may function as an anode.

A pixel-defining layer (PDL) 109 that includes an insulating material and that covers the pixel electrode 111 may be formed on the pixel electrode 111 to have a predetermined thickness. The PDL 109 may be formed of at least one organic insulating material, e.g., polyimide, polyamide, acryl resin, benzocyclobutene (BCB), or phenol resin, by spin coating or the like. The pixel area PX may be defined by forming a predetermined opening that exposes a central portion of the pixel electrode 111 in the PDL 109 and depositing the emission layer 113, which emits light from a predetermined area, in the opening.

The opposite electrode 112 may be formed of, e.g., Li, Ca, LiF/Ca, LiF/Al, Al, Mg, Ag, or the like, which have a small work function and may function as a cathode because the opposite electrode 112 may be formed on an entire surface of the substrate 100 as a common electrode.

The emission layer 113 may be a low-molecular or polymer organic layer, and a hole injection layer (HIL), a hole transport layer (HTL), an electron transport layer (ETL), an electron injection layer (EIL), or the like may be further stacked on the emission layer 113.

In an implementation, the emission layer 113 may be formed in each pixel such that one red pixel, one green pixel, and one blue pixel form one unit pixel. In an implementation, the emission layer 113 may be commonly formed on an entire pixel area PX irrespective of the pixel locations. In this case, the emission layer may be formed by vertically stacking or combining layers including emission materials that emit red, green, and blue colors of light. If the emission layer 113 is to emit white light, other colors of light may be combined. In addition, a color conversion layer or color filter, which converts the emitted white light into another color of light, may be further included.

The encapsulation substrate 200 covering the display unit 110 (including the OLED and the TFT) may face the substrate 100, and the substrate 100 and the encapsulation substrate 200 may be bonded to each other by the sealant 400 covering the display unit 110.

The encapsulation substrate 200 of FIG. 1 may be formed of various materials, e.g., glass, acryl, and/or metal, and the sealant 400 may be formed of, e.g., a glass frit.

As described above, the filling layer 300 may be disposed between the encapsulation substrate 200 and the display unit 110 and may be formed of, e.g., Si, polyimide, or the like.

Referring back to FIG. 2, a protection layer 120 may be formed on an outermost layer that directly contacts the filling layer 300 of the display unit 110. If the protection layer 120 were to be omitted, the filling layer 300 could be easily diffused and could penetrate the opposite electrode 112. Thus, the emission layer 113 could deteriorate. Thus, the protection layer 120 may be formed on the opposite electrode 112 to help reduce and/or prevent damage of the OLED which could otherwise be caused by expansion of the filling layer 300.

The protection layer 120 may include an alternate layer 121 in which inorganic layers 121*a* (which cover the pixel area PX where the emission layer 113 exists, e.g., which overlie and/or are aligned with the emission layer 113) and organic layers 121*b* (which cover areas except for or other than the pixel area PX) are alternately arranged on a same layer, e.g., on the opposite electrode 112. For example, the inorganic layers 121*a* and the organic layers may be in a laterally adjacent alternating arrangement on the opposite electrode. For example, the inorganic layers 121*a* may better prevent the penetration of impurities than the organic layers 121*b*, and the inorganic layers 121*a* may be formed on the pixel area PX (where the emission layer 113 is formed) in order to help reduce and/or prevent the direct penetration of impurities into the emission layer 113.

However, if only inorganic layers 121*a* were used to form the protection layer 120, the protection layer 120 could crack because of the expansion of the inorganic layers 121*a*. For example, if the impurities diffused from the filling layer 300 were to penetrate into the protection layer 120, shrinkage of protection layer 120 could occur. The inorganic layers 121*a* may not easily shrink because of low flexibility, and stress of the inorganic layers 121*a* may be delivered to the OLED (disposed below the inorganic layers 121*a*). Thus, the opposite electrode 112 could easily crack. If the opposite electrode 112 were to crack, the emission layer 113 may be damaged because of the cracks. Thus, according to an embodiment, the organic layers 121*b* (having good flexibility) may cover the areas except for or other than the pixel area PX (e.g., other than where the emission layer 113 exists) in order to help reduce and/or prevent the rupture of layers, which may be caused by the shrinkage.

For example, as described above, the alternate layer 121 (in which the inorganic layers 121*a* and the organic layers 121*b* are alternately arranged on the same layer) may form the protection layer 120.

When the alternate layer 121 forms the protection layer 120, the OLED may be stably and effectively protected.

The organic light-emitting display apparatus including the protection layer 120 may be manufactured by the following method.

The TFT and the OLED may be formed on the substrate 100, and the protection layer 120 may be formed on the opposite electrode 112 of the OLED. For example, the inorganic layers 121*a* (having a dense structure) may be formed on the pixel area PX, and the organic layers 121*b* may be formed on the areas except for the pixel area PX in order to provide flexibility. For example, by performing a mask process, the inorganic layers 121*a* and the organic layers 121*b* may be formed on the same layer in each respective area.

When the display unit 110 is formed, the sealant 400 may be formed around the display unit 110, and then, the encapsulation substrate 200, which is formed on a surface of the filling layer 300 and faces the substrate 100, is bonded to the substrate 100 by the sealant 400.

Then, the display unit 100 may be sealed in a space formed by the substrate 100, the encapsulation substrate 200, and the sealant 400. In this case, the filling layer 300 may fill a space between the encapsulation substrate 200 and the display unit 110, e.g., a space between the encapsulation substrate 200 and the protection layer 120.

The OLED may be protected by the protection layer 120 without directly contacting the filling layer 300, and the OLED may rarely be damaged or remain undamaged by impurities diffused from the filling layer 300. In addition, even if shrinkage of the protection layer 120 were to occur, the protection layer 120 may include the organic layers 121*b* having flexibility. Thus, cracks in the opposite electrode 112 may be prevented.

Therefore, when the organic light-emitting display apparatus according to the one or more exemplary embodiments is used, the OLED may be stably and effectively protected. Thus, products using the OLED may have increased durability and reliability.

In an implementation, the protection layer 120 may only include the alternate layer 121. In an implementation, a monolayer, which includes an organic layer or an inorganic layer, may be further stacked.

Figure 3:
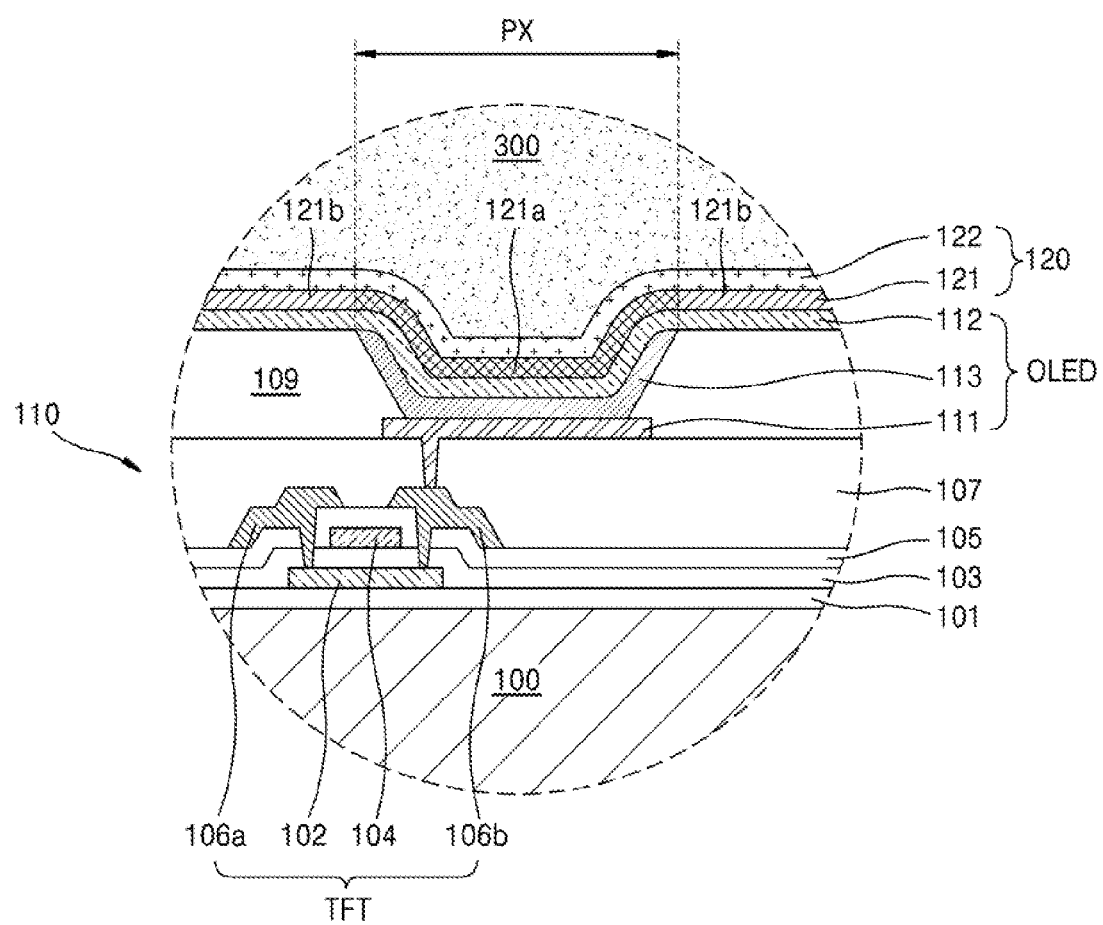
FIG. 3 illustrates a cross-sectional view of an organic light-emitting display apparatus according to another exemplary embodiment.

For example, as illustrated in FIG. 3, the monolayer 122, which may include an organic layer or an inorganic layer, may be further formed on the alternate layer 121. The monolayer 122 that is an organic layer may be added to increase the flexibility of the protection layer 120, or the monolayer 122 that is an inorganic layer may be added to help reduce and/or prevent the penetration of impurities into the emission layer 113.

Figure 4:
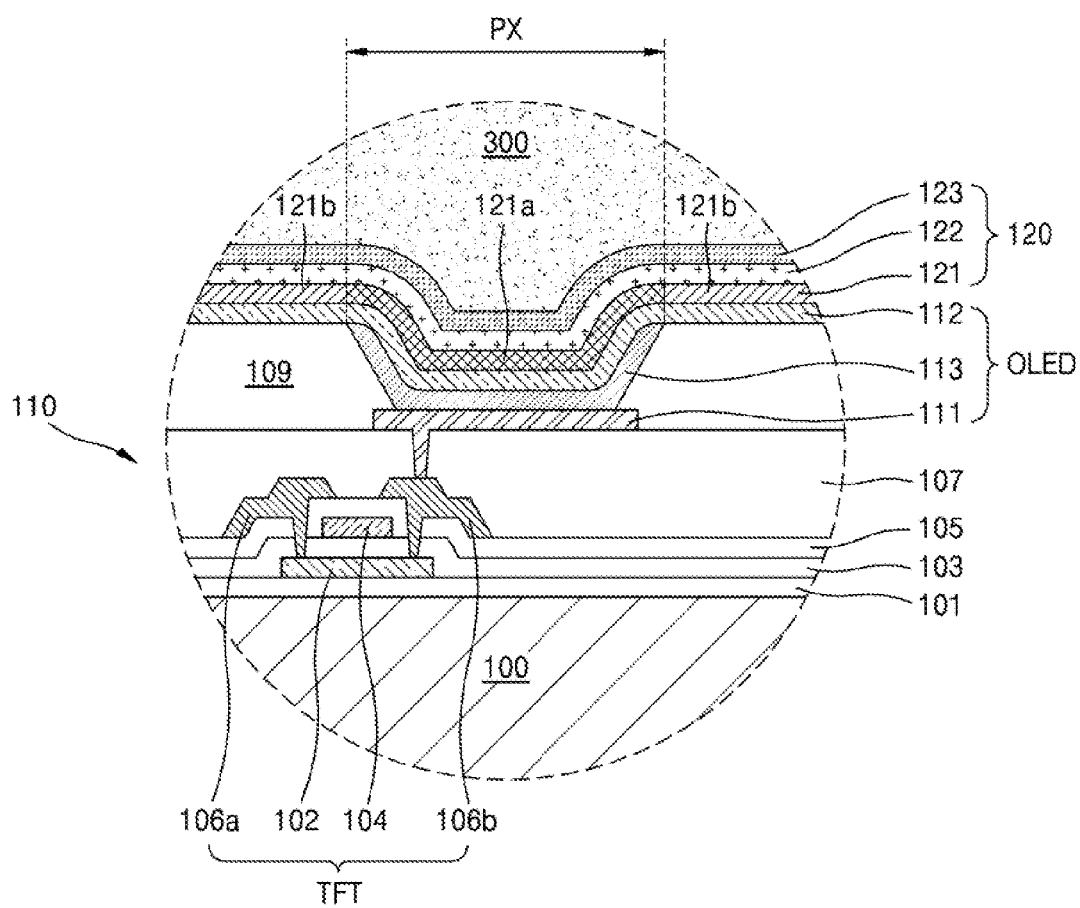
FIG. 4 illustrates a cross-sectional view of an organic light-emitting display apparatus according to another exemplary embodiment.

In an implementation, as illustrated in FIG. 4, two monolayers 122 and 123 may be further stacked. For example, one monolayer 122 may be an organic layer, and the other monolayer 123 may be an inorganic layer. For example, the alternate layer 121 may form the protection layer 120, and according to necessity or as desired, the monolayers 122 and 123 may be further formed.

According to the embodiments, the OLED may be stably and effectively protected, and products using the OLED may have increased durability and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate;
   an organic light-emitting diode (OLED), the OLED including:
      a pixel electrode on the substrate;
      an opposite electrode that faces the pixel electrode; and
      an emission layer between the pixel electrode and the opposite electrode; and
   a protection layer that covers the OLED,
   wherein the protection layer includes an alternate layer including alternately arranging organic layers and inorganic layers laterally adjacent to one another on a same layer such that substrate facing surfaces of the organic layers are continuous with substrate facing surfaces of portions of the inorganic layers overlying and aligned with the emission layer.

2. The organic light-emitting display apparatus as claimed in claim 1, wherein the inorganic layers are formed in a pixel area overlying the emission layer, and the organic layers are formed in an area other than the pixel area.

3. The organic light-emitting display apparatus as claimed in claim 1, further comprising:
   an encapsulation substrate on the protection layer, the encapsulation substrate facing the substrate; and
   a filling layer filling a space between the protection layer and the encapsulation substrate.

4. The organic light-emitting display apparatus as claimed in claim 1, further comprising a thin film transistor connected to the pixel electrode.

5. The organic light-emitting display apparatus as claimed in claim 1, further comprising at least one monolayer on the alternate layer, wherein the at least one monolayer is an organic layer or an inorganic layer.

6. A method of manufacturing an organic light-emitting display apparatus, the method comprising:
   forming an organic light-emitting diode (OLED) on a substrate such that the OLED includes:
      a pixel electrode on the substrate,
      an opposite electrode that faces the pixel electrode, and
      an emission layer between the pixel electrode and the opposite electrode; and
   forming a protection layer that covers the OLED,
   wherein forming the protection layer includes forming an alternate layer by alternately arranging organic layers and inorganic layers laterally adjacent to one another on a same layer such that substrate facing surfaces of the organic layers are continuous with substrate facing surfaces of portions of the inorganic layers overlying and aligned with the emission layer.

7. The method as claimed in claim 6, wherein:
   the inorganic layers are formed in a pixel area overlying the emission layer, and
   the organic layers are formed in an area other than the pixel area.

8. The method as claimed in claim 6, further comprising:
   providing an encapsulation substrate on the protection layer such that the encapsulation substrate faces the substrate; and
   filling a space between the protection layer and the encapsulation substrate with a filling layer.

9. The method as claimed in claim 6, further comprising forming a thin film transistor connected to the pixel electrode.

10. The method as claimed in claim 6, wherein forming the protection layer includes forming at least one monolayer on the alternate layer such that the at least one monolayer is an organic layer or an inorganic layer.

11. The organic light-emitting display apparatus as claimed in claim 3, wherein the organic layers are not between the encapsulation substrate and the emission layer in a direction orthogonal to a planar inner surface of the encapsulation substrate.

12. The method as claimed in claim 8, wherein the organic layers are not between the encapsulation substrate and the emission layer in a direction orthogonal to a planar inner surface of the encapsulation substrate.

* * * * *